United States Patent [19]
Agarwal

[11] Patent Number: 5,831,289
[45] Date of Patent: Nov. 3, 1998

[54] SILICON CARBIDE GATE TURN-OFF THYRISTOR ARRANGEMENT

[75] Inventor: Anant Agarwal, Monroeville, Pa.

[73] Assignee: Northrop Grumman Corporation, Los Angeles, Calif.

[21] Appl. No.: 944,252

[22] Filed: Oct. 6, 1997

[51] Int. Cl.⁶ .......................... H01L 31/312; H01L 29/71
[52] U.S. Cl. .......................... 257/77; 257/146; 257/135; 257/138; 257/133; 438/186
[58] Field of Search ................ 257/77, 133–135, 257/138, 146–147, 140, 256, 272; 438/186

[56] References Cited

U.S. PATENT DOCUMENTS

| | | | |
|---|---|---|---|
| 5,539,217 | 7/1996 | Edmond et al. | 257/147 |
| 5,614,737 | 3/1997 | Piccone | 257/124 |
| 5,641,695 | 6/1997 | Moore et al. | 438/186 |
| 5,719,409 | 2/1998 | Singh et al. | 257/77 |
| 5,744,826 | 4/1998 | Takeuchi et al. | 257/77 |
| 5,757,034 | 5/1998 | Ajit | 257/137 |
| 5,780,197 | 7/1998 | Mori | 257/147 |

*Primary Examiner*—Peter Toby Brown
*Assistant Examiner*—Hung Van Duong
*Attorney, Agent, or Firm*—Walter G. Sutcliff

[57] ABSTRACT

A silicon carbide gate turn off thyristor (GTO) has a silicon carbide junction field effect transistor (JFET) connected between the gate of the GTO and one of its anode or cathode electrodes thereby minimizing cooling requirements while providing for rapid switching.

6 Claims, 3 Drawing Sheets

SILICON CARBIDE GATE TURN-OFF THYRISTOR ARRANGEMENT

BACKGROUND OF THE INVENTION

1. Field of the Invention

The invention in general relates to thyristors and more particularly to a gate turn-off thyristor which can operate at high temperatures.

2. Description of Related Art

Thyristors are three terminal, unidirectional devices generally used for controlling or switching ac or dc power. Upon application of a signal to a gate terminal, forward current conduction is established between the other two terminals, which are the cathode and anode terminals. A class of thyristors known as gate turn-off thyristors (GTO) can terminate forward conduction simply upon the application of a reverse gate bias, as opposed to turning it off by reducing the main current below a critical value, such as required by a silicon controlled rectifier (SCR).

An improved GTO arrangement is known wherein a silicon GTO is controlled by a simple silicon metal oxide field effect transistor (MOSFET) thereby eliminating the normally complex and power consuming turn-off circuits previously required.

These devices operate at high voltages and high current and consequently develop a high operating temperature thereby requiring an elaborate cooling system. The present invention minimizes or eliminates the cooling requirements for such devices.

SUMMARY OF THE INVENTION

An improved field effect transistor (FET) controlled GTO is provided which includes a GTO comprised of a plurality of silicon carbide layers and including anode, cathode and gate electrodes. A silicon carbide junction field effect transistor (JFET) arrangement consisting of one or more silicon carbide JFETs includes source and drain electrodes electrically connected between the gate of the GTO and one of its anode or cathode electrodes. The JFET has a gate at which is established a signal condition to place the JFET into a selected one of an on and off condition whereby when in the on condition a low resistance conductive path is established between the gate electrode of the GTO and the selected one of the anode or cathode electrodes, to cause the GTO to turn off.

DESCRIPTION OF THE PREFERRED EMBODIMENT

Figure 1:
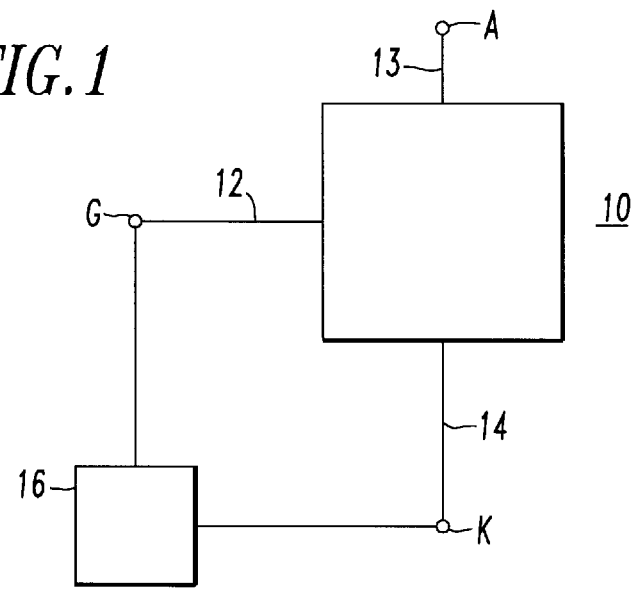
FIG. 1 is a block diagram of a GTO arrangement.

In the drawings, which are not necessarily to scale, like or corresponding parts are denoted by like or corresponding reference numerals.

In FIG. 1, block 10 represents a GTO comprised of a plurality of silicon semiconductor layers and having a gate terminal 12, an anode terminal 13 and a cathode terminal 14. An appropriate signal applied to the gate terminal 12 will cause the GTO to turn on and conduct high current between the anode and cathode terminals 12 and 14. The GTO may be turned off by application of an appropriate signal supplied by turn-off circuit 16, which is comprised of one or more silicon MOSFETs, and which provides a shorted path between the gate 12 and cathode 14 to effect the turn off function.

Figure 2:
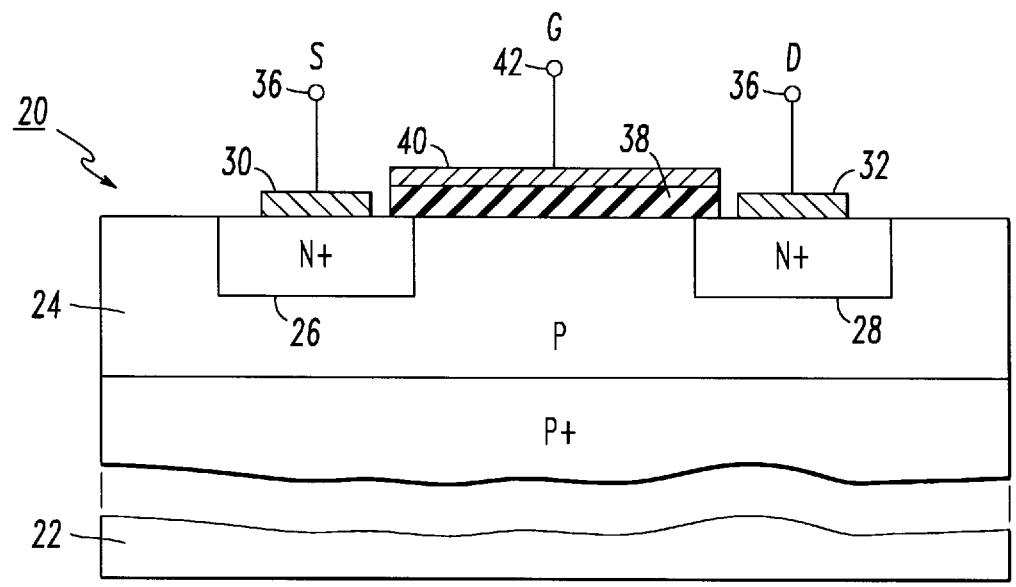
FIG. 2 is a sectional view of one type of MOSFET which may be used in the turn off of the GTO of FIG. 1.

A typical MOSFET is illustrated in FIG. 2. The MOSFET 20 is fabricated on a silicon substrate member 22 of P+ type conductivity and upon which is deposited a layer of P type conductivity 24. The MOSFET includes source and drain regions 26 and 28 of N+ type conductivity to which are connected respective electrodes 30 and 32, and terminals 34 and 36.

An oxide layer 38 such as silicon dioxide, is deposited on the surface of the layer 24 and electrical connection is made by means of electrode 40 and gate terminal 42. Current is established between the source and drain terminals 34 and 36 as a function of a signal applied to the gate terminal 42. Although a lateral MOSFET is illustrated, the function may also be provided by a vertical MOSFET.

During operation, high current, for example hundreds of amperes, flowing in the GTO generates a correspondingly high temperature in the GTO and MOSFET. Temperatures ranging to 500° C., or higher may be generated and at these temperatures the silicon components utilized break down. To ensure for proper operation therefore, such devices require appropriate cooling arrangements which include large and heavy heat sinks. Where space and weight requirements are to be minimized, such arrangement is not suitable.

Figure 3:
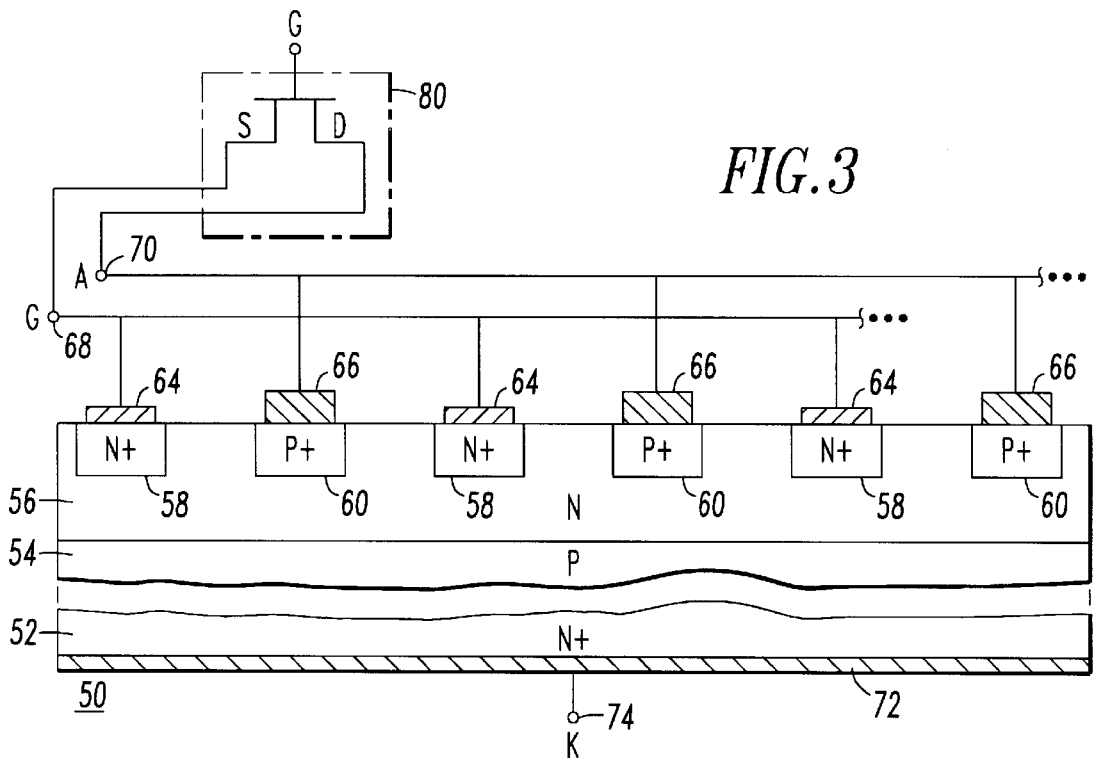
FIG. 3 is a sectional view of one embodiment of the present invention.

FIG. 3 illustrates one embodiment of the present invention which allows operation at the elevated temperatures encountered, with no, or minimal cooling requirements. In FIG. 3, a GTO 50 is provided and is comprised of a plurality of semiconductor layers of silicon carbide which has a thermal conductivity three times larger than conventional semiconductor materials and has the ability to operate at higher voltages and temperatures than conventional silicon or gallium arsenide devices.

In a first layer arrangement GTO 50 includes a substrate member 52 of N+ type conductivity upon which are deposited silicon carbide layers 54 and 56 of P type and N type conductivity, respectively. Gate regions and anode regions are typically formed as a plurality of individual islands, or regions. By way of example FIG. 3 illustrates a plurality of gate regions 58 of N+ type conductivity and a plurality of anode regions 60 of P+ type conductivity. These regions include respective electrodes 64 and 66 to which are connected to respective terminals 68 and 70. A cathode electrode 72 and cathode terminal 74 are coupled to the opposite side of substrate member 52.

In order to provide for the turn off function, there is included a JFET arrangement which includes at least one JFET 80, but preferably includes an array of silicon carbide JFETs each having a source S and drain D electrically connected between the gate and anode (for the arrangement of FIG. 3) of the GTO 50. An appropriate signal condition at the gate G of the JFET 80 will place the JFET into an on or off condition and when in the on condition the JFET 80 provides a short, or low resistance path between the GTO gate and GTO anode to effect the turn off of the GTO 50.

Figure 4A:
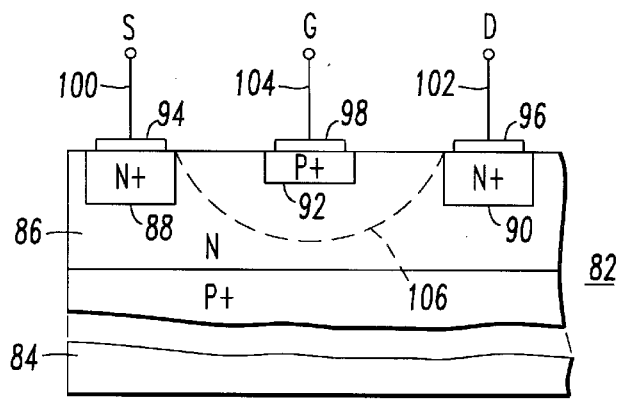
FIGS. 4A and 4B are sectional views of JFETs which may be used herein.

One type of JFET which may be used herein is illustrated in FIG. 4A. The JFET 82 is fabricated on a silicon carbide substrate member 84 of P+ type conductivity upon which is deposited a silicon carbide layer 86 of N type conductivity. Respective source, drain and gate regions 88, 90 and 92 are defined in the layer 86 and electrical connection is made by means of respective electrodes 94, 96 and 98 and terminals 100, 102 and 104.

For the JFET 82 illustrated, a depletion layer, as depicted by the dotted line 106, allows a current to flow, in the channel below the depletion layer, between the source and drain regions, in the absence of an applied gate bias. Accordingly JFET 82 is normally in an on condition, maintaining the GTO in an off condition, and a negative gate bias must be applied to allow current flow between the anode and cathode of the GTO to which the JFET is connected.

Figure 4B:
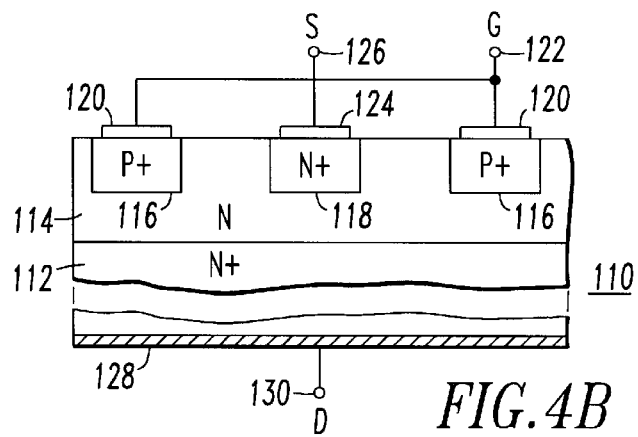

FIG. 4A illustrates a lateral JFET. Another type of JFET, a vertical JFET, is illustrated in FIG. 4B. JFET 110 includes a silicon carbide substrate member 112 of N+ type conductivity upon which is deposited a silicon carbide layer 114 of N type conductivity. Source regions 116 of P+ type conductivity are defined in layer 114, as is gate region 118 of N+ type conductivity. Electrodes 120 of source regions 116 are connected to source terminal 122 and gate electrode 124 is connected to gate terminal 126. A suitable drain electrode 128 with terminal 130 is formed on the opposite side of substrate 112. These JFETs may be fabricated as an integral part of the GTO which it controls or may be separately fabricated and thereafter affixed to the GTO such as by a high temperature adhesive.

Figure 5:
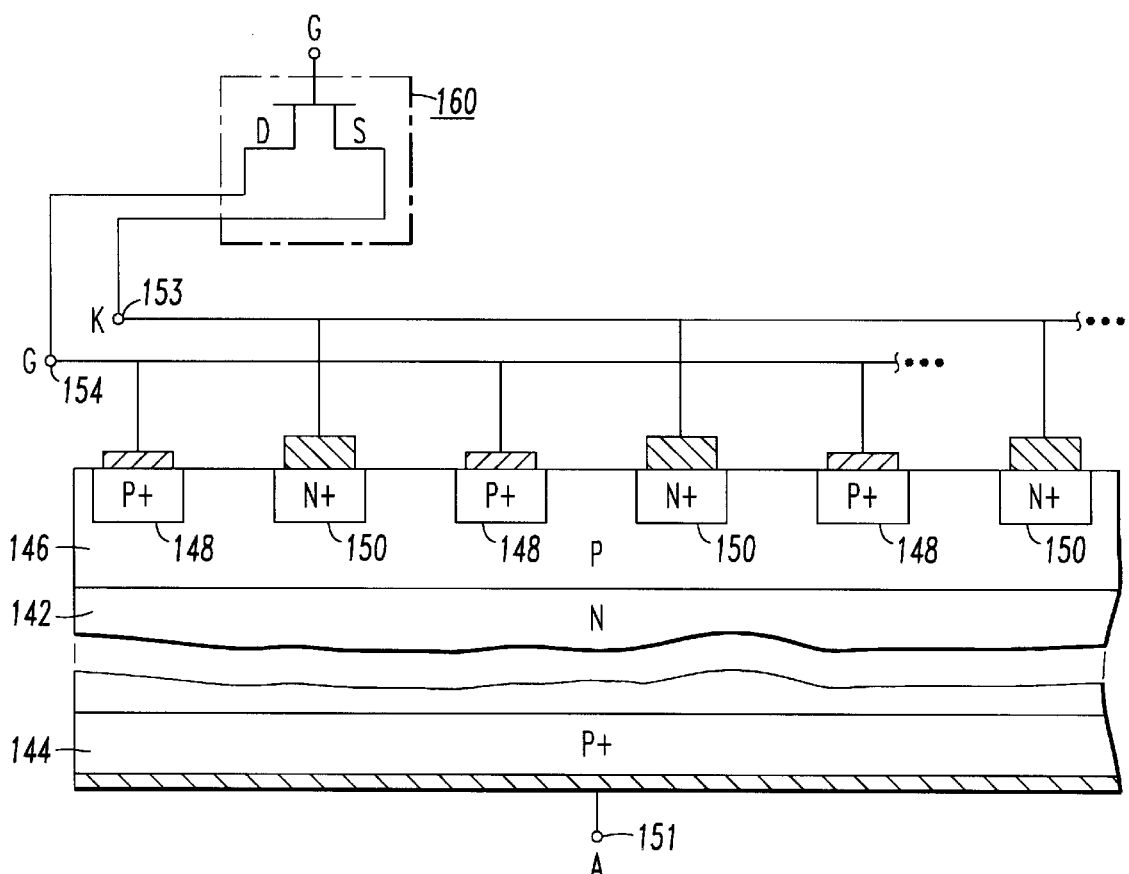
FIG. 5 illustrates an alternative arrangement of the present invention.

The JFET in all cases need not be connected between the gate and anode of the GTO. By way of example, FIG. 5 illustrates a second GTO layer arrangement wherein a JFET is connected between the GTO gate and cathode, as opposed to the anode. In this arrangement the GTO 140 includes a silicon carbide substrate member 142 of N type conductivity on opposite sides of which are respective P+ and P silicon carbide layers 144 and 146. Defined within layer 146 are a plurality of P+ gate regions 148 electrically connected together and a plurality of N+ cathode regions 150 electrically connected together. The GTO anode 151 is formed at the layer 144.

In a manner similar to that of FIG. 3, a silicon carbide JFET arrangement 150 is provided and, as seen in FIG. 5, includes a source S electrically connected to the cathode terminal 152, and a drain D electrically connected to gate terminal 154, of GTO 140.

In addition to providing an arrangement with reduced cooling requirements, the present invention also provides enhanced dV/dT capability. That is, the silicon carbide JFET has a smaller on-resistance than a comparable MOSFET and as such, the switching time for the JFET is advantageously faster.

Although the present invention has been described with a certain degree of particularity, it is to be understood that various substitutions and modifications may be made without departing from the spirit and scope of the invention as defined in the appended claims.

What is claimed is:

1. An improved FET controlled GTO, comprising:

(A) a GTO comprised of a plurality of silicon carbide semiconductor layers and including anode, cathode and gate electrodes;

(B) a silicon carbide JFET arrangement having at least one silicon carbide JFET and having source and drain electrodes electrically connected between said gate and a selected one of said anode and cathode electrodes of said GTO;

(C) said silicon carbide JFET having an input gate for establishing a signal condition to place said silicon carbide JFET into a selected one of an on and off condition, whereby when in said on condition a low resistance conducting path is established between said gate of said GTO and said selected one of said anode and cathode electrodes of said GTO, to turn off said GTO.

2. An improved FET controlled GTO in accordance with claim 1 wherein:

(A) said silicon carbide JFET arrangement includes a plurality of silicon carbide JFETs each having a source, drain and gate, connected to respective source, drain and gates of the other silicon carbide JFETs of said arrangement.

3. An improved FET controlled GTO according to claim 1 wherein:

(A) said silicon carbide layers of said GTO are of a first predetermined conductivity arrangement; and (B) said source and drain of said silicon carbide JFET are connected between said gate of said GTO and said anode of said GTO.

4. An improved FET controlled GTO according to claim 1 wherein:

(A) said silicon carbide layers of said GTO are of a second predetermined conductivity arrangement; and (B) said source and drain of said silicon carbide JFET are connected between said gate of said GTO and said cathode of said GTO.

5. An improved FET controlled GTO according to claim 1 wherein:

(A) said silicon carbide JFET is a lateral JFET.

6. An improved FET controlled GTO according to claim 1 wherein:

(A) said silicon carbide JFET is a vertical JFET.

* * * * *